United States Patent
Chandra et al.

(10) Patent No.: US 7,642,852 B2
(45) Date of Patent: Jan. 5, 2010

(54) RESISTOR SELF-TRIM CIRCUIT FOR INCREASED PERFORMANCE

(75) Inventors: Gaurav Chandra, Richardson, TX (US); Danielle Lyn Griffith, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 81 days.

(21) Appl. No.: 12/109,449

(22) Filed: Apr. 25, 2008

(65) Prior Publication Data

US 2009/0267693 A1  Oct. 29, 2009

(51) Int. Cl.
  *H03F 3/45* (2006.01)
(52) U.S. Cl. .................................. 330/258; 330/259
(58) Field of Classification Search .................. 330/258, 330/259, 2, 9
  See application file for complete search history.

(56) References Cited

U.S. PATENT DOCUMENTS 5,610,557 A * 3/1997 Jett, Jr. ....................... 330/261
6,900,663 B1 * 5/2005 Roper et al. .................. 326/83
2009/0108936 A1 * 4/2009 Forejt .......................... 330/258

* cited by examiner

Primary Examiner—Steven J Mottola
(74) Attorney, Agent, or Firm—Ronald O. Neerings; Wade James Brady, III; Frederick J. Telecky, Jr.

(57) ABSTRACT

In a method and apparatus for trimming values of load resistors to reduce variations there between, a common mode feedback loop (CMFBL) included in a differential amplifier is switched from operating in a closed loop mode to operate in an open loop mode. The CMFBL includes an operational amplifier (OA) generating an output signal. A selector switch, coupled to receive the output signal, is operable to switch a path of the output signal in response to a CAL signal. In the closed loop mode, the selector switch routes the output signal to a feedback loop to provide a regulated current to the load resistors. In the open loop mode, the OA operates as a comparator and the output signal is provided as a digital signal. The selector switch provides the digital signal to a controller to digitally trim the values of the load resistors.

20 Claims, 5 Drawing Sheets

RESISTOR SELF-TRIM CIRCUIT FOR INCREASED PERFORMANCE

BACKGROUND

The present disclosure relates generally to electronic circuits, and more particularly to a method and an apparatus for improving the performance of amplifiers.

FIG. 1A illustrates a circuit diagram of a differential amplifier 100, which is often used as an input stage for integrated circuit (IC) amplifiers that are typically included in mixed signal processing, radio frequency (RF) transceivers, and wireless communication applications. A differential input signal 110 that is applied to terminals INP 112 and INM 114 respectively is amplified by transistors M1P 120 and M1M 130 respectively. Both the transistors M1P 120 and M1M 130 are driven by a current source 140 (also referred to as a tail current source). The differential input signal 110 is amplified by a transconductance gain factor gm to generate an output signal 150 presented across output terminals OUTP 160 and OUTM 162. A load resistor RLP 170 is coupled between the output terminal OUTP 160 and a voltage reference 180. Similarly, a load resistor RLM 172 is coupled between the output terminal OUTM 162 and the voltage reference 180. The load resistors RLP 170 and RLM 172 are preferably identical to balance the differential amplifier 100. Well known performance metrics for the differential amplifier 100 often include a common mode rejection ratio (CMRR) and a power supply rejection ratio (PSRR).

FIG. 1B illustrates a circuit diagram of a differential amplifier 102 having a feedback loop 104 to improve performance including improvement in the CMRR and PSRR ratios. A pair of resistors RB 182 is coupled between the output terminals OUTP 160 and OUTM 162, the pair of resistors RB 182 forming a node NBAL 184. Thus, voltage at NBAL 184 is the common mode voltage measured between the output terminals OUTP 160 and OUTM 162. An operational amplifier (OA) 190 includes a positive terminal coupled to the node NBAL 184 and a negative terminal coupled to a reference voltage VCMREF 192. The OA 190 generates an output VOUT 194 in response to the inputs received from the node NBAL 184 and VCMREF 192. The output VOUT 194 is provided as a feedback to control transistors M2P 174 (coupled in parallel with RLP 170) and M2M 176 (coupled in parallel with RLM 172). In a balanced state, the voltage at NBAL 184 is equal to the reference voltage VCMREF 192, the current flowing through M2P 174 and M2M 176 is at a fixed known (minimum) current value to overcome component variations and the voltage VOUT 194 is determined accordingly and may have a direct current (DC) bias. Thus, a feedback loop 104 controls an amount of current flowing through the resistors RLP 170 and RLM 172 in response to a change (positive or negative) in the differential input signal 110.

The differential amplifier circuit 102 is, however, sensitive to component variations often present in IC's manufactured using deep sub-micron technology. A large variation in a value of resistor RLP 170 compared to that of RLM 172 may cause the feedback loop 104 to go out-of-range since the current flowing through M2P 174 and M2M 176 approaches zero. To achieve a balanced circuit, it is a common practice to trim the value of resistors RLP 170 and RLM 172 in order to minimize the impact of component variations. The prior art resistive trimming techniques may typically include laser trimming, blowing fusable links, or shorting diodes. However, such resistive trimming procedures often require that a separate trimming circuit be physically present on the same IC as the differential amplifier circuit 102, thereby increasing the silicon area. In addition, such trim procedures rely on an accurate matching of a benchmark resistor included in the trimming circuit with resistors RLP 170 and RLM 172 used in the actual circuit. Therefore, a need exists to provide an improved differential amplifier having a resistive load that is capable of being trimmed efficiently without incurring a substantial penalty in noise performance, power consumption, and silicon area.

SUMMARY

Applicants recognize that variations (caused by process, voltage, and temperature (PVT) changes) in the value of the load resistors may be as large as plus or minus 40%, especially in deep sub-micron circuits. In order to reduce the possibility of an out-of-range condition for the feedback loop in a differential amplifier circuit, it would be desirable to maintain a nominal bias current (having a sufficiently large value) to flow through the feedback control transistors, thereby ensuring operation of the feedback loop under various PVT conditions. However, applicants also recognize that higher current flowing through a transistor implies higher transconductance for these transistors. This results in higher noise, because the noise, being a function of the transconductance, is greater when the transconductance is higher. Thus, the technique of increasing the nominal bias current through the transistors M2P 174 and M2M 176 often results in a substantial noise penalty and an increase in power consumption of the differential amplifier circuit. Therefore, it would be desirable to provide an improved resistor trimming technique for differential amplifiers that is efficient in terms of silicon area usage, power consumption usage, noise performance, cost, and complexity. Accordingly, it would be desirable to provide a method and apparatus for trimming values of load resistors to reduce variations there between, absent the disadvantages found in the prior methods discussed above.

The foregoing needs are addressed by the teachings of the present disclosure, which relates to an apparatus and method for resistor trimming. According to one embodiment, in an apparatus and method for trimming values of load resistors to reduce variations there between, a common mode feedback loop (CMFBL) included in a differential amplifier is switched from operating in a closed loop mode to operate in an open loop mode. The CMFBL includes an operational amplifier (OA) generating an output signal. A selector switch, coupled to receive the output signal, is operable to switch a path of the output signal in response to a CAL signal. In the closed loop mode, the selector switch routes the output signal to a feedback loop to control the transistors M2P 174 and M2M 176, that provide a regulated current to the load resistors. In the open loop mode, the OA operates as a comparator and the output signal is provided as a digital signal. The selector switch provides the digital signal to a controller to digitally trim the values of the load resistors.

In one aspect of the disclosure, a method for trimming load resistors includes providing a differential amplifier having a common mode feedback loop (CMFBL), the CMFBL being operable in one operating mode to provide control of a regulated current to the load resistors. One or more components of the differential amplifier are reused to enable the resistor trimming by simply changing a mode of operation of the CMFBL. An output signal of the CMFBL operating in another mode is indicative of a variation in values of the load resistors. A digital trim signal is derived from the output signal. The values of the load resistors are trimmed with the digital trim signal to reduce the variation below a configurable threshold. Upon completion of the trimming of the load resistors, the original operating mode of the CMFBL mode is restored.

Several advantages are achieved by the method and apparatus according to the illustrative embodiments presented herein. The embodiments advantageously provide an improved method and apparatus for digitally trimming values of load resistors to reduce variations there between. The technique advantageously provides reduction in silicon area and power consumption (compared to the differential amplifier 102 described with reference to FIG. 1B) by reusing one or more components of a differential amplifier having a common mode feedback loop (CMFBL) operable to provide regulated current to the load resistors. In addition, the technique to reuse components provides reduced variation caused by process and voltage fluctuations. The technique advantageously switches the operating mode of the CMFBL from a closed loop mode of operation to an open loop mode of operation to perform the trimming. The CMFBL includes an operational amplifier (OA) generating an output signal. A selector switch, coupled to receive the output signal, is operable to switch a path of the output signal in response to a CAL signal. In the closed loop mode, the selector switch routes the output signal (that is an analog signal) to a feedback loop to provide the regulated current to the load resistors. In the open loop mode, the OA operates as a comparator and the output signal is provided as a 1-bit digital signal. The selector switch provides the 1-bit digital signal to a controller. The controller derives an n-bit digital trim signal from the 1-bit digital signal. The digital trim signal is used to digitally trim the values of the load resistors. Upon completion of the trimming of the load resistors, the closed loop operating mode of the CMFBL is restored and only a small bias current is drawn by the transistor switches in the feedback loop, thereby improving CMRR and PSRR, and improving noise performance. The trimming technique may be repeated and new values derived to accommodate temperature variations.

DETAILED DESCRIPTION

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, subassemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

Figure 1A:
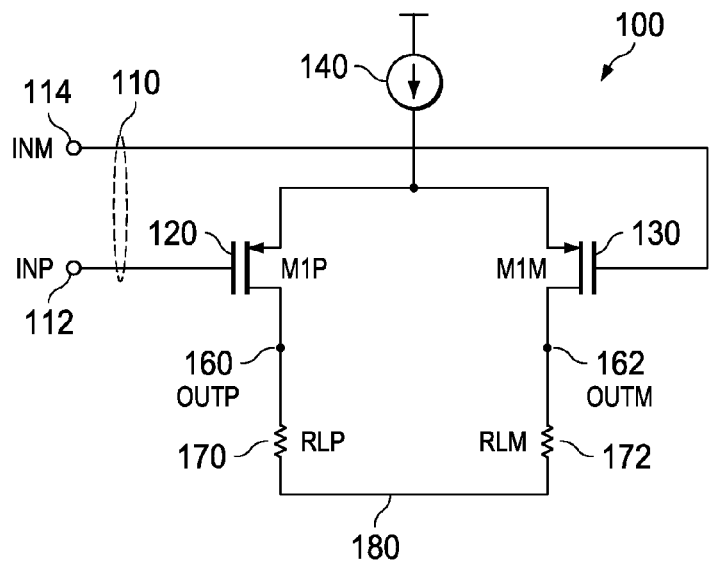
FIG. 1A illustrates a circuit diagram of a differential amplifier, described herein above, according to prior art.
Figure 1B:
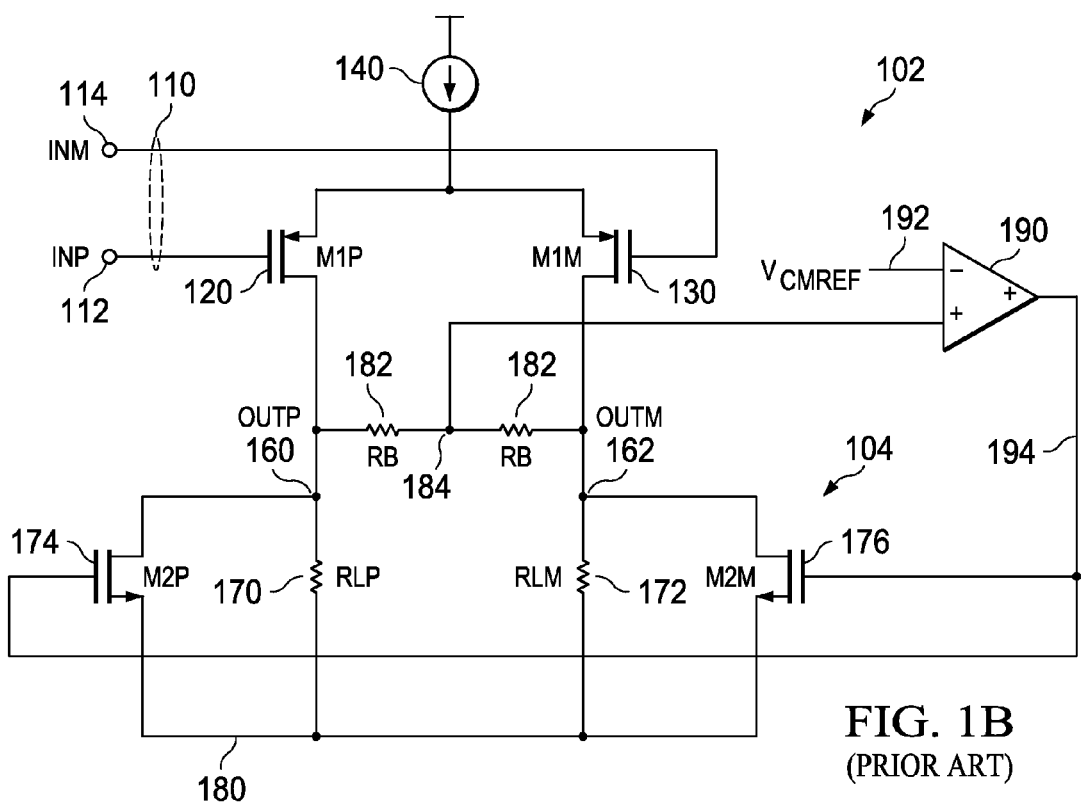
FIG. 1B a circuit diagram of a differential amplifier having a feedback loop for improved performance, described herein above, according to prior art.

The traditional differential amplifiers 100 and 102 described with reference to FIGS. 1A and 1B typically deploy resistive trimming procedures that often require that a separate trimming circuit which is physically present on the same IC as the differential amplifier circuit 100 or 102, thereby increasing the silicon area. In addition, such trim procedures rely on an accurate matching of a benchmark resistor included in the trimming circuit with load resistors used in the actual circuit. Therefore, a need exists to provide a method and apparatus for trimming resistive load of a differential amplifier. This problem may be addressed by an improved apparatus and method for trimming values of load resistors to reduce variations there between by switching modes of operation of the differential amplifier.

According to one embodiment, in a method and apparatus for trimming values of load resistors to reduce variations there between, a common mode feedback loop (CMFBL) included in a differential amplifier is switched from operating in a closed loop mode to operate in an open loop mode. The CMFBL includes an operational amplifier (OA) generating an output signal. A selector switch, coupled to receive the output signal, is operable to switch a path of the output signal in response to a CAL signal. In the closed loop mode, the selector switch routes the output signal to a feedback loop to provide a regulated current to the load resistors. In the open loop mode, the OA operates as a comparator and the output signal is provided as a digital signal. The selector switch provides the digital signal to a controller to digitally trim the values of the load resistors.

The following terminology may be useful in understanding the present disclosure. It is to be understood that the terminology described herein is for the purpose of description and should not be regarded as limiting.

Semiconductor Device—A semiconductor device is an electronic component that utilizes electronic properties of semiconductor materials to perform a desired function. A semiconductor device may be manufactured as a single discrete device or as one or more integrated circuits (ICs) packaged into a module.

Configuration—Describes a set up of an element, a circuit, a package, an electronic device, and similar other, and refers to a process for setting, defining, or selecting particular properties, parameters, or attributes of the device prior to its use or operation. Some configuration attributes may be selected to have a default value. For example, a gain of an amplifier may be configured to be equal to one (1) to enable an output signal to simply track an input signal.

Amplifier—An electronic circuit that draws power from a power source to boost or amplify one or more input signals. Some amplifiers may be configured to simply track or isolate an input signal without providing amplification. Some of the desirable amplifier characteristics include high input impedance, high gain, and low output impedance. Amplifiers may be configured in multiple topologies including cascade, cascode, differential, and similar others to achieve desired characteristics. Amplifiers may also be configured to operate in various classes such as A, B, AB, C, D, and similar others depending on the desired input/output signal characteristics.

Self-trim Resistor Circuit—A resistor circuit having one or more resistors that are capable of being trimmed or adjusted to a desired value without the use of any other on-chip or off-chip reference resistors or trimming circuits.

An apparatus in the form of an improved differential amplifier having a common mode feedback loop (CMFBL) and having an improved load resistor trimming technique compared to a traditional differential amplifier, e.g., the differential amplifier 102, is described with reference to FIGS. 2 and 3. A load resistor capable of being trimmed by a digital signal is described with reference to FIG. 4. A method for trimming load resistors of a differential amplifier is described with reference to FIGS. 5A and 5B.

Figure 2:
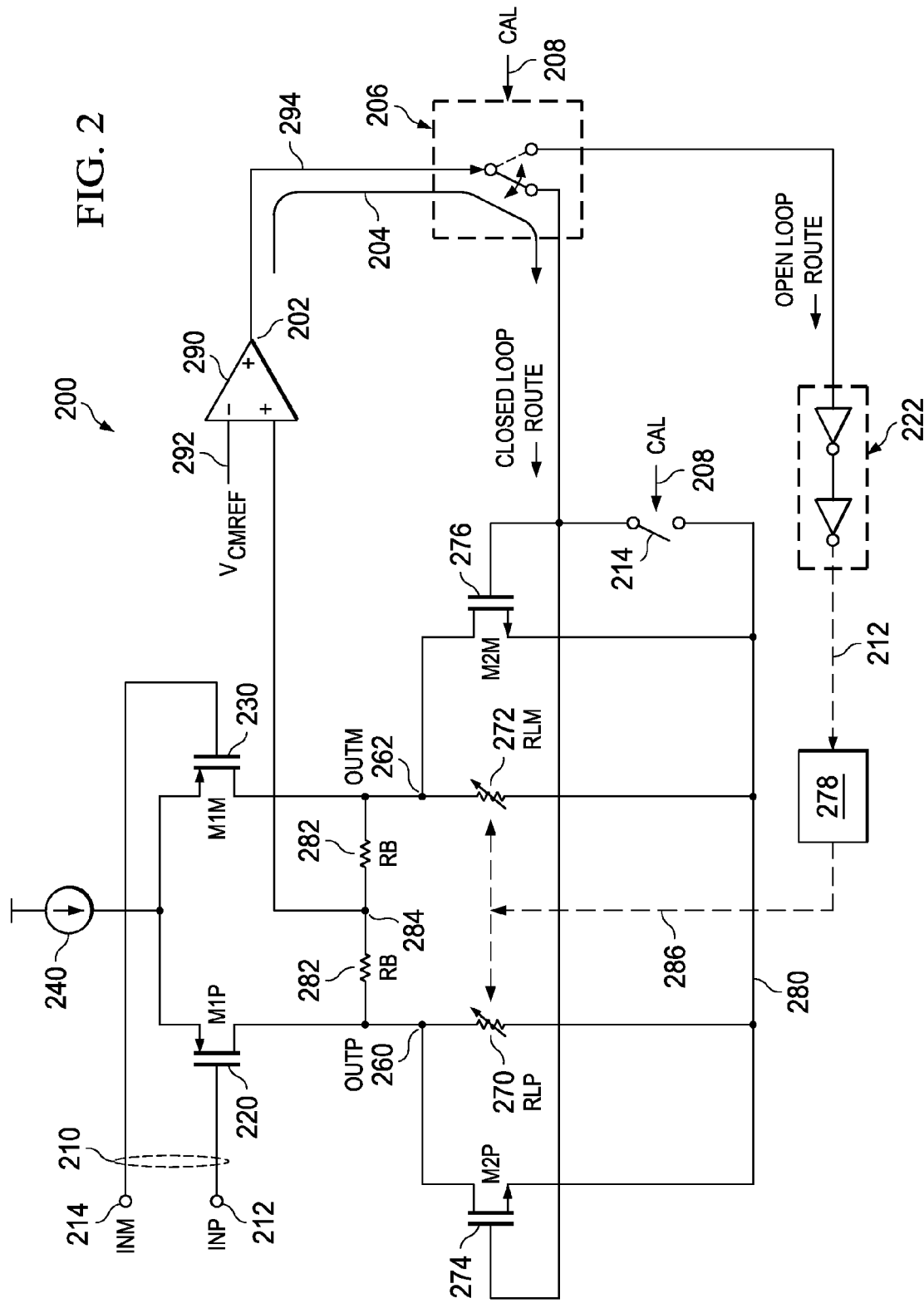
FIG. 2 illustrates a circuit diagram of an improved differential amplifier, according to an embodiment.

FIG. 2 illustrates a circuit diagram of an improved differential amplifier 200, according to an embodiment. A differential input signal 210 is applied across terminals INP 212 and INM 214 of the differential amplifier 200 and is amplified by switches M1P 220 and M1M 230. Both the switches M1P 220 and M1M 230 are driven by a current source 240 (also referred to as a tail current source). The differential input signal 210 is amplified by a transconductance gain factor gm to generate an output provided across output terminals OUTP 260 and OUTM 262. A load resistor RLP 270 is coupled between the output terminal OUTP 260 and a voltage reference 280 such as a ground reference. Similarly, a load resistor RLM 272 is coupled between the output terminal OUTM 262 and the voltage reference 280. The values of the load resistors RLP 270 and RLM 272 may be different due to variations in process, voltage and temperature conditions. In a particular embodiment, the values of the load resistors RLP 270 and RLM 272 are capable of being self-trimmed, e.g., independent of use of any other resistance or circuit to perform the trimming, to substantially reduce the variation there between. After the self-trimming (also referred to simply as trimming), a difference between the trimmed values of the load resistors RLP 270 and RLM 272 is less than a configurable threshold. Additional details of trimming the value of a load resistor are described with reference to FIGS. 4 and 5.

The differential amplifier 200 includes a common mode feedback loop (CMFBL) 204 that is operable in one of a closed loop mode (used to regulate load current) and an open loop mode (used to trim resistor values) by controlling a selector switch 206 with a CAL signal 208. In a particular embodiment, the CMFBL 204 may be configured to operate in the closed loop mode as a default. In an embodiment, when the CAL signal 208 is de-asserted the selector switch 206 enables the CMFBL 204 to provide the regulated current in the closed loop mode. Thus, operation in the closed loop mode enables a flow of regulated current through the load resistors RLP 270 and RLM 272, thereby improving the CMRR and PSRR ratios. When the CAL signal 208 is asserted, the selector switch 206 enables the CMFBL 204 to self-trim values of the load resistors RLP 270 and RLM 272 in the open loop mode.

A pair of resistors RB 282 is coupled between the output terminals OUTP 260 and OUTM 262, the pair of resistors RB 282 forming a node NBAL 284. Thus, voltage at NBAL 284 is the common mode (CM) voltage measured between the output terminals OUTP 260 and OUTM 262. Although the depicted embodiment illustrates resistive sensing techniques of measuring CM voltage, it is understood that other CM voltage sensing techniques including capacitive coupling, use of active transistors and similar others may also be used. An operational amplifier (OA) 290 includes a positive terminal coupled to the node NBAL 284 and a negative terminal coupled to a reference voltage VCMREF 292. The OA 290 generates an output signal VOUT 294 at the output terminal 296 in response to the inputs received at the node NBAL 284 and VCMREF 292. In an exemplary, non-depicted embodiment, the OA 290 may be coupled to a clock input for synchronous operation.

A path of the output signal VOUT 294 is controlled by the selector switch 206 in dependence of the operating mode of the CMFBL 204. A function performed by the OA 290 is in dependence of the mode of operation. That is, the OA 290 is configured to operate as an analog operational amplifier having an analog output in the closed loop mode and as a comparator having a digital output in the open loop mode. Therefore, the output signal VOUT 294 is an analog signal in the closed loop mode and the output signal VOUT 294 is a digital signal, e.g., a 1-bit digital signal. One or more optional inverters 222 may be included to amplify or boost a voltage level of the output signal VOUT 294.

In the closed loop mode, the selector switch 206 routes the output signal VOUT 294 as a feedback signal to control switches M2P 274 (coupled in parallel with RLP 270) and M2M 276 (coupled in parallel with RLM 272). In a balanced state of the differential amplifier 200, the differential input signal 210 is zero, the voltage at NBAL 284 is equal to the reference voltage VCMREF 292, the current flowing through M2P 274 and M2M 276 is at a fixed known (minimum) current value to overcome component variations and the voltage VOUT 294 is determined accordingly and may have a DC bias. In the closed loop mode, each one of the switches M1P 220 and M1M 230 and switches M2P 274 and M2M 276 is operating in a saturation region. Thus, a common mode feedback loop 204 controls an amount of current flowing through the resistors RLP 270 and RLM 272 in response to a change (positive or negative) in the differential input signal 210.

In the open loop mode, the differential input signal 210 is held at a constant value, e.g., by coupling the terminals INP 212 and INM 214 to the same signal source. The OA 290 operates as a comparator by comparing signals received at the NBAL 284 and VCMREF 292 nodes. In a 1-bit digital comparator, if signal at the NBAL 284 is greater than the signal at VCMREF 292 then the digital output signal 294 is a logic high. If signal at the NBAL 284 is less than the signal at VCMREF 292 then the digital output signal 294 is a logic low. The selector switch 206, controlled by asserting the CAL signal 208, routes the output signal VOUT 294 to optional inverters 222 that output a digital control signal 212.

A controller 278 receives the digital control signal 212 and uses the digital control signal 212 to derive a digital trim signal 286 that is used to trim the values of the load resistors RLP 270 and RLM 272. If the optional inverter 222 is not present, the digital control signal 212 is the same as the output signal 294 and the controller 278 may directly receive the output signal 294. In an embodiment, a digital control algorithm such as successive approximation may be used to derive the digital trim signal 286 from the digital control signal 212. The controller 278 is an on-chip general purpose microcontroller or an on-board script processor that is capable of executing a digital sequence. No additional or dedicated hardware may be used to implement the controller 278. In a particular embodiment, the digital trim signal 286 is an n-bit digital signal. The load resistors RLP 170 and RLM 172 are capable of being trimmed with the digital trim signal 286 having n-bits. A value of n, e.g., between 1 and 24, is selectable to reduce variation between trimmed values of the load resistors RLP 170 and RLM 172 below a configurable threshold. A ground switch 214, controlled by CAL 208, is asserted to enable the switches M2P 274 and M2M 276 to be coupled to a voltage reference 216 such as a ground reference. In the open loop mode, the switches M2P 274 and M2M 276 operate in the cut-off region. As a default, the ground switch 214 may be configured to be open in the closed loop mode.

As described earlier, prior to the trimming, the inputs (received from node NBAL 284 and VCMREF 292) to the OA 290 (which is now functioning as a comparator) are imbalanced due to the variation in the values of the load resistors RLP 270 and RLM 272. The n-bit digital trim signal 286 is used to perform the trimming so that the inputs at the node NBAL 284 and VCMREF 292 are balanced. That is, the controller 278 adjusts the n-bits of the digital trim signal 286 sequencing one bit at a time to incrementally change the values of the load resistors 170, 172 until the controller 278 detects a change of state of the digital control signal 212. When a transition of state of the output signal 294 generated by OA 290 is detected the trimmed values of the load resistors 170, 172 are approximately equal, e.g., are balanced and within a configurable threshold. Since the OA 290 has a binary output the trimmed values may not be exactly equal. In a particular embodiment, the digital trim signal 286 is concurrently provided to each one of the load resistors RLP 270 and RLM 272 to trim the values in parallel.

If I_DC is the value of the current source 240 then a voltage across the output terminals OUTP 260 and OUTM 262 is the same and is equal to (I_DC/2)*RL, where RL is the desired or trimmed value of the load resistors RLP 270 and RLM 272. Thus, in the balanced state $$(I\_DC/2)*RL = \text{Voltage at } VCMREF \qquad \text{Equation 100}$$

RL is nominally selected in accordance with the Equation 100. Hence, the trimming technique is independent of the use of any other resistor used as a reference. In addition, the trimming technique is also independent of the use of a separate trimming circuit often present on the same IC as the traditional differential amplifier circuit 102. Depending on a number of transistors used in the separate trimming circuit of a traditional differential amplifier, the savings in silicon area may be as high as 90%. Thus, the trimming technique advantageously provides dramatic reduction in silicon area and power consumption (compared to the differential amplifier 102 described with reference to FIG. 1B).

After completion of the trimming the values of the load resistors RLP 270 and RLM 272, the operating mode of the CMFBL 204 is switched from open loop to closed loop mode. Specifically, the selector switch 206 controlled by CAL 208 is switched to route the output signal VOUT 294 used as a feedback signal to control switches M2P 274 and M2M 276 operating in the saturation region and the ground switch 214 is opened. With the completion of the trimming the circuit is balanced and a value of the bias current flowing through the switches M2P 274 and M2M 276 is reduced to a minimum to maintain operation in the saturation region, thereby avoiding out-of-range operation and reducing noise and power consumption compared to differential amplifier 102 described with reference to FIG. 1B.

The differential amplifier 200 deploying the self-trimming technique is advantageously less dependent on the process and voltage variations compared to the differential amplifier 102 since the differential amplifier 200 reuses one or more elements, e.g., OA 290, to perform the trimming. To accommodate changes in the values of the load resistors caused due temperature variations, e.g., temperature drift, the trimming process for the differential amplifier 200 may be repeated on an on-demand or periodic basis.

Figure 3:
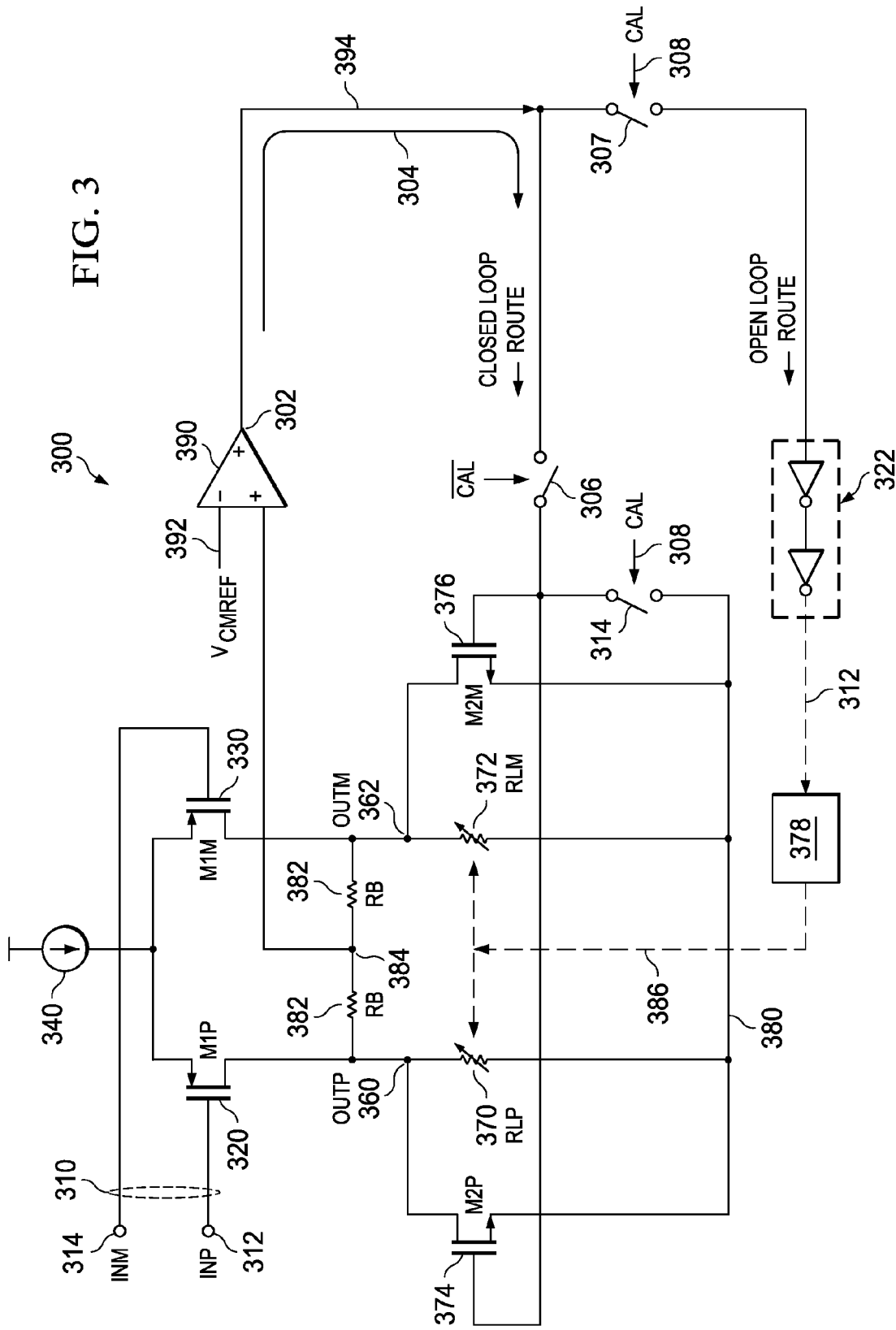
FIG. 3 illustrates a circuit diagram of another improved differential amplifier, according to an embodiment.

FIG. 3 illustrates a circuit diagram of an improved differential amplifier 300, according to an embodiment. The differential amplifier 300 is substantially the same as the differential amplifier 200 described with reference to FIG. 2 except for the selector switch 206, which is replaced by a first switch 306 and a second switch 307. The first switch 306 is controlled by an inverse of CAL 308 to route an output signal 394 as a feedback signal in the closed loop mode or disable the output signal 394 from being routed in the open loop mode. The second switch 307 is controlled by CAL 308 to route the output signal 394 to control the trimming of the load resistors RLP 370 and RLM 372 in the open loop mode or disable the output signal 394 from being routed to perform the trimming of load resistors in the closed loop mode. In addition, the ground switch 214 is described as a third switch 314. Operation of the differential amplifier 300 is identical to that of the differential amplifier 200. Thus, features and benefits described with reference to FIG. 2 also apply to the differential amplifier 300.

Figure 4:
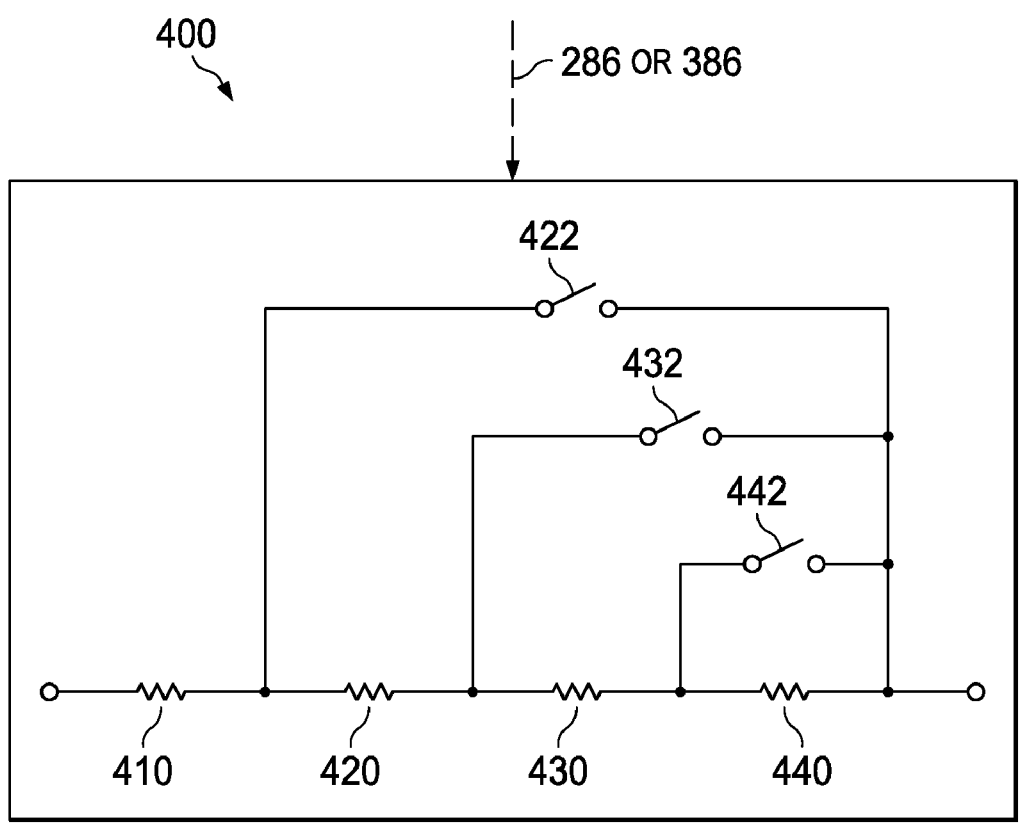
FIG. 4 illustrates a circuit diagram of a load resistor (LR) capable of being trimmed with a digital signal.

FIG. 4 illustrates a circuit diagram of a load resistor (LR) 400 capable of being trimmed with a digital trim signal, according to an embodiment. In a particular embodiment, the load resistor 400 is the same as each one of the load resistors RLP 270 and RLM 272 described with reference to FIG. 2 and resistors RLP 370 and RLM 372 described with reference to FIG. 3. The resistor RL 400 may be implemented as a fixed value resistor R0 410 in series with a plurality of incrementally valued load resistors R1 420, R2 430 and R3 440. The inclusion or exclusion of the load resistors R1 420, R2 430, and R3 440 is controlled by corresponding switches 422, 432, and 442 controlled by the digital trim signal 286 or 386. For example, if a nominal value of 10K ohms is desired, then only switch 442 may be closed to short out R3 440 and achieving a nominal value of 10K. Variations in values from the nominal value caused by process and voltage changes may be trimmed in accordance with the bits included in the digital trim signal 286 or 386, e.g., by opening or closing switches 422, 432, and 442 to achieve a balance. A number of switches are determined by the accuracy level desired.

Figure 5A:
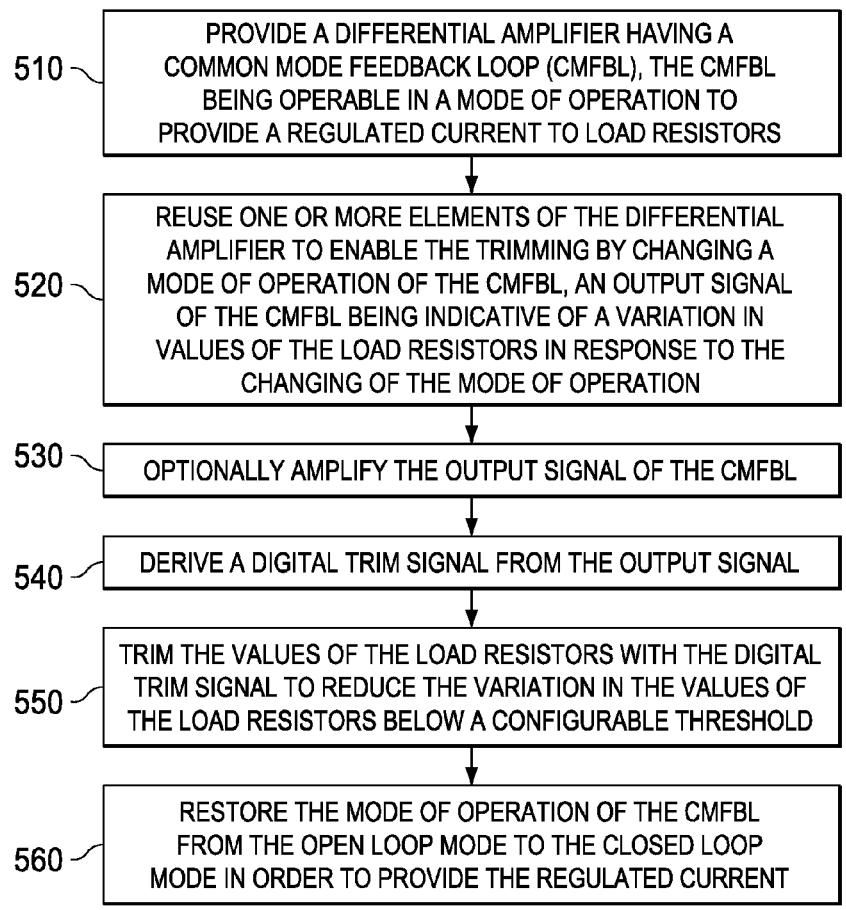
FIG. 5A is a flow chart illustrating a method for trimming load resistors, according to an embodiment.

FIG. 5A is a flow chart illustrating a method for trimming load resistors, according to an embodiment. In a particular embodiment, the method is used to trim the load resistors included in the differential amplifiers 200 or 300 described with reference to FIGS. 2, 3, and 4. At step 510, a differential amplifier having a common mode feedback loop (CMFBL) is provided, the CMFBL being operable in a mode of operation, e.g., closed loop mode, to provide a regulated current to the load resistors. At step 520, one or more elements of the differential amplifier are reused to enable the trimming by changing a mode of operation of the CMFBL. An output signal of the CMFBL is indicative of a variation in values of the load resistors in response to the changing of the mode of operation. At step 530, the output signal of the CMFBL is optionally amplified. At step 540, a digital trim signal is derived from the output signal. At step 550, the values of the load resistors are trimmed with the digital trim signal to reduce the variation in the values of the load resistors below a configurable threshold. At step 560, the mode of operation of the CMFBL is restored from the open loop mode to the closed loop mode in order to provide the regulated current.

Figure 5B:
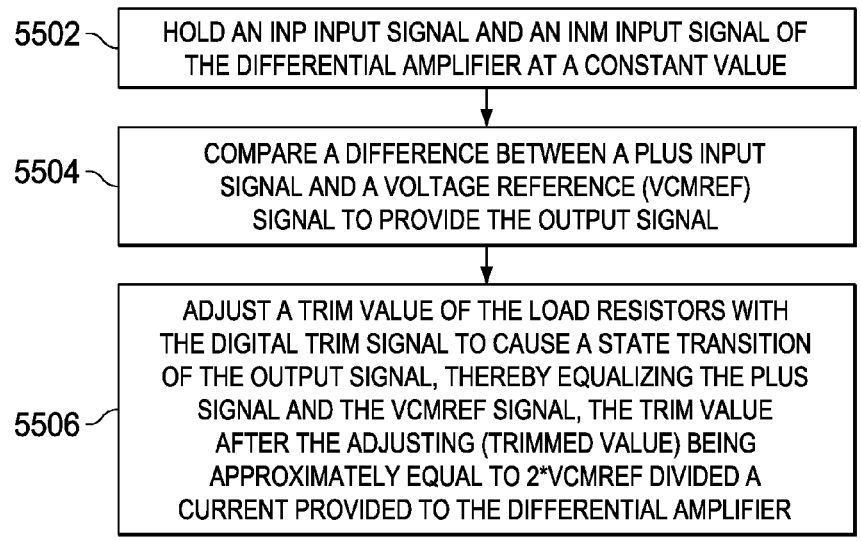
FIG. 5B is a flow chart illustrating a method for trimming load resistors with an output signal, according to an embodiment.

Various steps described above may be added, omitted, combined, altered, or performed in different orders. For example, step 550 may be divided to include additional steps 5502, 5504 and 5506. FIG. 5B is a flow chart illustrating a method for trimming load resistors with a digital trim signal, according to an embodiment. At step 5502, an INP input signal and an INM input signal of the differential amplifier are held at a constant value. At step 5504, a difference between a plus input signal and a voltage reference (VCMREF) signal is compared to provide the output signal. At step 5506, a trim value of the load resistors is adjusted or trimmed with the digital trim signal to cause a state transition of the trim value after the adjusting (trimmed value) is approximately equal to 2*VCMREF divided a current provided to the differential amplifier.

Several advantages are achieved by the method and system according to the illustrative embodiments presented herein. The embodiments advantageously provide an improved method and apparatus for digitally trimming values of load resistors to reduce variations there between. The technique advantageously provides reduction in silicon area and power consumption (compared to the differential amplifier 102 described with reference to FIG. 1B) by reusing one or more components of a differential amplifier having a common mode feedback loop (CMFBL) operable to provide regulated current to the load resistors. In addition, the technique to reuse components provides reduced variation caused by process and voltage fluctuations. The technique advantageously switches the operating mode of the CMFBL from a closed loop mode of operation to an open loop mode of operation to perform the trimming. The CMFBL includes an operational amplifier (OA) generating an output signal. A selector switch, coupled to receive the output signal, is operable to switch a path of the output signal in response to a CAL signal. In the closed loop mode, the selector switch routes the output signal (that is an analog signal) to a feedback loop to provide the regulated current to the load resistors. In the open loop mode, the OA operates as a comparator and the output signal is provided as a 1-bit digital signal. The selector switch provides the 1-bit digital signal to a controller. The controller derives an n-bit digital trim signal from the 1-bit digital signal. The digital trim signal is used to digitally trim the values of the load resistors. Upon completion of the trimming of the load resistors, the closed loop operating mode of the CMFBL is restored and only a small bias current is drawn by the transistor switches in the feedback loop, thereby improving CMRR and PSRR, and improving noise performance. The trimming technique may be repeated and new values derived to accommodate temperature variations.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of a differential amplifier, those of ordinary skill in the art will appreciate that the apparatus and methods disclosed herein are capable of being implemented in any balanced circuit having different operating modes and having at least one reusable element that has a different functionality in the different modes. As another example, the various switches described with reference to the improved differential amplifier may be implemented using CMOS semiconductor devices or implemented using a combination of CMOS and BJT semiconductor devices.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for trimming load resistors, the method comprising:
   providing a differential amplifier having a common mode feedback loop (CMFBL), the CMFBL operable in a mode of operation to provide a regulated current to the load resistors;
   reusing the differential amplifier to enable the trimming by changing the mode of operation of the CMFBL, wherein an output signal of the CMFBL is indicative of a variation in values of the load resistors in response to the changing of the mode of operation;
   deriving a digital trim signal from the output signal; and
   trimming the values of the load resistors with the digital trim signal to reduce the variation below a configurable threshold.

2. The method of claim 1 further comprising:
   restoring the mode of operation to provide the regulated current.

3. The method of claim 1, further comprising:
   amplifying the output signal prior to the deriving of the digital trim signal.

4. The method of claim 1, wherein the trimming of the load resistors is performed independent of a reference resistor.

5. The method of claim 1, wherein the trimming of the load resistors is performed independent of a separate on-chip trimming circuit.

6. The method of claim 1, wherein the changing of the mode of operation of the CMFBL further comprises:
   opening a first switch to disable the output signal being provided to control a pair of switches, the pair of switches capable of shunting the regulated current from the load resistors;
   closing a second switch to redirect the output signal to derive the digital trim signal; and
   closing a third switch to couple the pair of switches to a voltage reference.

7. The method of claim 1, wherein the changing of the mode of operation of the CMFBL includes reusing an operational amplifier (OA) of the differential amplifier to operate as a comparator, wherein the output signal is switched from an analog signal to a digital signal in response to the changing.

8. The method of claim 1, wherein the trimming includes:
   holding an INP input signal and an INM input signal of the differential amplifier at a constant value;

comparing with the comparator a difference between a plus input signal and a voltage reference (VCMREF) signal to provide the output signal; and adjusting a trim value of the load resistors with the digital trim signal to cause a state transition of the digital signal, wherein a difference between a value A and a value B is less than a configurable threshold, wherein the value of A is the trim value after the adjusting and the value of B is 2*VCMREF divided a current provided to the differential amplifier.

9. The method of claim 1, wherein the deriving includes:

receiving the output signal as a 1-bit digital signal;

modifying the 1-bit digital signal to the digital trim signal having n-bits, wherein the load resistors are capable of being trimmed with the n-bits, wherein a value of n is selectable to reduce variation between trimmed values of the load resistors below a configurable threshold.

10. An apparatus comprising:

a differential amplifier having a common mode feedback loop (CMFBL), the CMFBL being capable of operating in a closed loop mode and an open loop mode, wherein the CMFBL operating in the closed loop mode provides control of a regulated current supplied to load resistors, wherein the CMFBL operating in the open loop mode enables values of the load resistors to be trimmed; and a selector switch coupled to receive an output signal of the CMFBL, the selector switch being controlled by a CAL signal to switch a path of the output signal in accordance with the closed loop mode and the open loop mode; and a controller operable to receive the output signal from the selector switch in the open loop mode and provide a digital trim signal to trim the values of the load resistors.

11. The apparatus of claim 10, further comprising:

a ground switch coupled to the selector switch operating in the open loop mode, the ground switch being controlled by the CAL signal, wherein the ground switch couples a pair of switches to a voltage reference, the pair of switches being coupled in parallel with the load resistors.

12. The apparatus of claim 10, further comprising:

an inverter coupled to the selector switch operating in the open loop mode, the inverter being operable to receive the output signal and provide an amplified output signal.

13. The apparatus of claim 10, wherein the output signal is indicative of a variation in the values of the load resistors measurable in the open loop mode.

14. The apparatus of claim 10, wherein the CMFBL includes an operational amplifier (OA) operable to provide the output signal, wherein the OA is reusable as a comparator in the open loop mode, wherein the output signal is switched from an analog signal in the closed loop mode to a digital signal in the open loop mode.

15. The apparatus of claim 10, wherein the digital trim signal is configured to have n bits, where a value of n is selectable to reduce variation between trimmed values of the load resistors below a configurable threshold.

16. The apparatus of claim 10, wherein the values of the load resistors are trimmed independent of a separate on-chip trimming circuit.

17. The apparatus of claim 10, wherein the values of the load resistors are trimmed independent of a reference resistor.

18. An apparatus comprising:

a differential amplifier having a common mode feedback loop (CMFBL), the CMFBL being capable of operating in a closed loop mode and an open loop mode, wherein the CMFBL operating in the closed loop mode provides control of a regulated current supplied to load resistors, wherein the CMFBL operating in the open loop mode enables values of the load resistors to be trimmed;

a first switch coupled to receive an output signal of the CMFBL, the first switch being controlled by an inverse of a CAL signal to place the CMFBL in one of the closed loop mode and the open loop mode;

a second switch coupled to receive the output signal, the second switch being controlled by the CAL signal, the second switch operating in the open loop mode redirects the output signal to enable the load resistors to be trimmed; and a controller operable to receive the output signal from the second switch in the open loop mode and provide a digital trim signal to trim the values of the load resistors.

19. The apparatus of claim 18, further comprising:

a third switch coupled to the first switch operating in the open loop mode, the third switch being controlled by the CAL signal, wherein the third switch couples a pair of switches to a voltage reference, the pair of switches being coupled in parallel with the load resistors.

20. The apparatus of claim 18, wherein the CMFBL includes an operational amplifier (OA) operable to provide the output signal, wherein the OA is reusable as a comparator in the open loop mode, wherein the output signal is switched from an analog signal in the closed loop mode to a digital signal in the open loop mode.

* * * * *